United States Patent
Smith

(10) Patent No.: US 7,856,583 B1
(45) Date of Patent: Dec. 21, 2010

(54) TECHNIQUES FOR ENHANCED RELIABILITY OF DATA TRANSFER WITH DYNAMIC SCALING

(75) Inventor: Bruce Smith, Livermore, CA (US)

(73) Assignee: Network Equipment Technologies, Inc., Fremont, CA (US)

( * ) Notice: Subject to any disclaimer, the term of this patent is extended or adjusted under 35 U.S.C. 154(b) by 1496 days.

(21) Appl. No.: 11/229,248

(22) Filed: Sep. 16, 2005

(51) Int. Cl.
*H03M 13/00* (2006.01)

(52) U.S. Cl. .......................................... 714/746; 714/4
(58) Field of Classification Search ..................... 714/4, 714/746
See application file for complete search history.

(56) References Cited

U.S. PATENT DOCUMENTS

| | | | | |
|---|---|---|---|---|
| 6,122,754 A * | 9/2000 | Litwin et al. | | 714/4 |
| 6,282,684 B1 * | 8/2001 | Kondo et al. | | 714/752 |
| 6,389,562 B1 * | 5/2002 | Kondo et al. | | 714/701 |
| 6,445,717 B1 * | 9/2002 | Gibson et al. | | 370/473 |
| 6,895,019 B2 * | 5/2005 | Gibson et al. | | 370/473 |
| 6,963,999 B2 * | 11/2005 | Kondo et al. | | 714/701 |
| 2002/0069363 A1 * | 6/2002 | Winburn | | 713/200 |

\* cited by examiner

*Primary Examiner*—Esaw T Abraham
(74) *Attorney, Agent, or Firm*—Townsend and Townsend and Crew LLP

(57) ABSTRACT

A recovery chunk is generated based on information found in each chunk in a group of chunks. For example, the group of chunks includes three chunks of which information in the three chunks is used to generate a recovery chunk. The recovery chunk is then used to recover a single lost chunk in the group of chunks. The three chunks and the recovery chunk are sent to a receiver over a network. If one of the three chunks is lost, the recovery chunk is used to generate the lost chunk. The recovery chunk is used to recover a single lost chunk, however, the recovery chunk is not used to recover more than one lost chunk in the group. The number of chunks is also dynamically adjusted based on chunk loss at a receiver. This adjustment is based on the bandwidth used and reliability desired.

21 Claims, 4 Drawing Sheets

TECHNIQUES FOR ENHANCED RELIABILITY OF DATA TRANSFER WITH DYNAMIC SCALING

BACKGROUND OF THE INVENTION

Embodiments of the present invention generally relate to telecommunications and more specifically to techniques for providing chunk loss recovery for a group of chunks communicated across a network.

Data loss may occur when transferring data in chunks across an unreliable network. For example, data may be broken into chunks of data, which are sent through the unreliable network. The chunks may be sent using any medium transfer unit, such as packets, cells, etc. When time-sensitive information, such as time division multiplex (TDM), constant bit rate (CBR), variable bit rate-real time (VBR-RT), etc. information, suffers any loss of information, the quality of the communication is greatly reduced. For example, if the data loss is large for data sent during a telephone call, a conversation may become unintelligible.

Accordingly, a transmitter may provide techniques for recovering data loss. For example, the transmitter may use complete redundancy where a redundant chunk for each chunk is also transmitted to the receiver. Thus, if a chunk is lost, it is possible that the redundant chunk that was sent may be received and used in place of the lost chunk. Complete redundancy, however, uses a large amount of bandwidth because double the amount of chunks have to be sent to a receiver. This may increase overhead and also cause congestion at the receiver, which has to process double the amount of chunks for data being sent.

Also, if no redundancy is used, the overhead is low but any chunks lost cannot be recovered. Thus, the quality of the data transmission at the receiver may be adversely affected.

BRIEF SUMMARY OF THE INVENTION

Embodiments of the present invention generally relate to providing for chunk loss recovery using a recovery chunk generated for a group of chunks communicated across a network.

In one embodiment, a recovery chunk is generated based on information found in each chunk in a group of chunks. For example, the group of chunks may include three chunks of which information in the three chunks is used to generate a recovery chunk. The recovery chunk is generated such that it may be used to recover a single lost chunk in the group of chunks.

The three chunks and the recovery chunk are sent to a receiver over a network. For example, the chunks may be sent in medium transfer units, such as in packets, cells, etc. If one of the three chunks is lost (i.e., a packet or cell is lost), the recovery chunk may be used to generate the lost chunk.

In one embodiment, a parity algorithm may be used to generate the lost chunk using the recovery chunk and the rest of the received chunks in the group. The recovery chunk may be used to recover a single lost chunk, however, the recovery chunk may not be used to recover more than one lost chunk in the group in one embodiment. Accordingly, how large the group of chunks that are used to generate the recovery chunk is important. It is desirable that all lost chunks be received but a balance between the number of recovery chunks sent and the likelihood of recovering lost chunks is needed. Historical data on chunk loss may be analyzed in order to determine a size for the group of chunks. For example, if chunk loss is low at a receiver, then the group of chunks used to generate a recovery chunk may be increased. Because chunk loss is low, it is likely that in a larger group, a single lost chunk may occur and thus the recovery chunk can be used to recover the lost chunk. In this case, fewer recovery chunks are sent per number of chunks, which means bandwidth use is decreased and thus efficiency is increased. However, if chunk loss at a receiver is great, then the size of the group of chunks may be decreased. Because chunk loss is high, it is likely that in a smaller group, a single lost chunk may occur and thus the recovery chunk can be used to recover the lost chunk. In this case, more recovery chunks are sent per number of chunks, which means bandwidth use is increased, but the likelihood of recovering a lost chunk is increased.

In one embodiment, a method for providing for chunk loss recovery is provided. The method comprises: determining data for transmission to a device; determining a plurality of chunks to group with a recovery chunk; creating the plurality of chunks from the data; creating a recovery chunk from information in each of the number of chunks; and sending the plurality of chunks and the recovery chunk to the device, wherein the device can use the information in the recovery chunk to recover a single lost chunk in the plurality of chunks, wherein the recovery chunk cannot be used to recover more than one lost chunk in the plurality of chunks.

In another embodiment, a method for providing for chunk loss recovery is provided. The method comprises: analyzing historical chunk loss at a receiver; determining a number of chunks to include in a group for a single recovery chunk based on the analysis; receiving data for transmission to a device; creating a plurality of chunks from the data equal to the number of chunks to include in the group; creating a recovery chunk from information in each of the plurality of chunks; sending the plurality of chunks and the recovery chunk to the device; and dynamically adjusting the number of chunks to include in the group for the single recovery chunk based on chunk loss at the receiver, wherein the number in the group is decreased if chunk loss at the receiver is determined to have increased and the number in the group is increased if chunk loss is determined to have decreased.

In yet another embodiment, a system for providing for chunk loss recovery is provided. The method comprises: a transmitter comprising: a data creator configured to determine data for transmission to a device; a chunk assembler configured to: determine a plurality of chunks to group with a recovery chunk; create the plurality of chunks from the data; create a recovery chunk from information in each of the number of chunks; and a communicater configured to send the plurality of chunks and the recovery chunk; a receiver comprising: a chunk receiver configured to receive the plurality of chunks and the recovery chunk, the receiver comprising: a chunk validator configured to validate whether a chunk is lost in the plurality of chunks that was sent from the communicator; a chunk recovery device configured to use the information in the recovery chunk to recover a single lost chunk in the plurality of chunks, wherein the recovery chunk cannot be used to recover more than one lost chunk in the plurality of chunks.

A further understanding of the nature and the advantages of the inventions disclosed herein may be realized by reference of the remaining portions of the specification and the attached drawings.

DETAILED DESCRIPTION OF THE INVENTION

Figure 1:
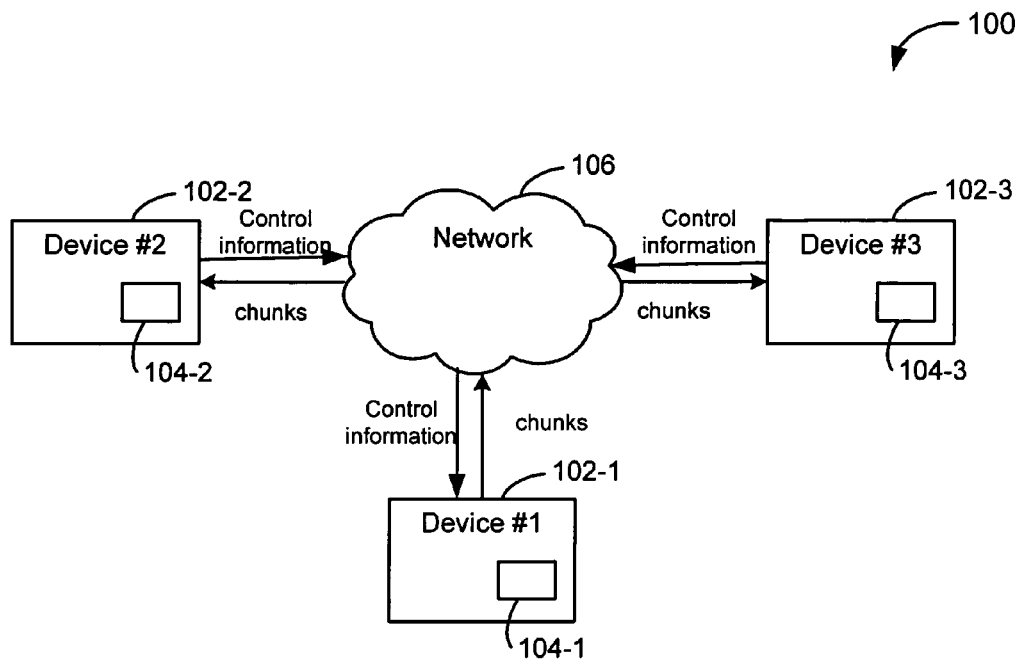
FIG. 1 depicts a system for providing chunk loss recovery according to one embodiment of the present invention.

FIG. 1 depicts a system 100 for providing chunk loss recovery according to one embodiment of the present invention. As shown, system 100 includes devices 102 and network 106.

Devices 102 include any network telecommunication devices configured to send and receive data. For example, devices 102 include routers, switches, gateways, or any other telecommunication devices. Devices 102 are configured to send data that may be time sensitive. For example, the data being sent may be in the form of time division multiplex (TDM) information, constant bit rate (CBR) information, variable bit rate-real time (VBR-RT) information, and other time sensitive forms of information. Although time-sensitive information is described, it will be recognized that the chunk loss recovery techniques may be used for any information being sent, such as for any non-time sensitive data.

Network 106 includes any network configured to transfer data. For example, network 106 may be the Internet, a local area network (LAN), a wide area network (WAN), a wireless network, etc. The chunks of data may be included in medium transfer units that are communicated across network 106. Medium transfer units may be any unit that is used to transfer data across network 106. Example medium transfer units include Ethernet packets, ATM cells, etc.

In one embodiment, network 106 is an unreliable network where chunks sent through the network may be lost. For example, the packets or cells transferring the chunks may be lost.

Devices 102 include a connection manager 104. Connection manager 104 is configured to send and receive chunks of data. When device 102 is transmitting data to another device, connection manager 104 is configured to generate a recovery chunk for a group of chunks. As will be described in more detail, a number of chunks to be included in the group is determined. The recovery chunk is generated using information in each chunk of the group. The group of chunks is then sent along with the recovery chunk to another device 102. The recovery chunk may be used to recover a single chunk in the group of chunks if a chunk is lost.

A receiver of the chunks includes a connection manager 104 that is configured to use a recovery chunk to generate a lost chunk in the group of chunks. For example, an algorithm may be used to generate the lost chunk from information in the recovery chunk and the received chunks. Connection manager 104, however, may not be able to recover the lost chunk if more than one lost chunk is lost in the group. In some embodiments, connection manager 104 may be able to generate parts of the lost chunk but may not be able to regenerate the whole chunk. In other embodiments, more than one chunk may be regenerated. For example, information may be inferred or determined from the received chunks and the recovery chunk to determine the lost chunks.

As will be discussed in more detail below, the number of chunks included in a group for a recovery chunk may be dynamically adjusted. In one embodiment, receivers of chunks may analyze chunk loss to determine the number of chunks to include in a group. For example, if only one chunk can be recovered in a group and chunk loss is high at a receiver, then the number of chunks in a group may be decreased. This would increase the chance that one chunk or less is lost in a group. However, this increases bandwidth used because the number of recovery packets sent across a connection increases. Accordingly, a balance between bandwidth used and reliability is desired.

As shown in FIG. 1, transmission control information may flow from receivers to the transmitter, such as from devices 102-2 and 102-3 to device 102-1. In another embodiment, the transmission control information may be multicast to all devices 102. In yet another embodiment, the transmission control information may be received at a node, which analyzes transmission control information from multiple devices 102 determine transmission control information based on the information received from multiple devices. For example, the transmission control information from multiple devices 102 may be summarized, averaged, the smallest group length, etc.

It should be noted that system 100 provides a chunk level recovery system in one embodiment. Thus, when chunks are lost, the chunks may be regenerated. This is different than a bit level recovery system where bits in a chunk may be recovered.

Figure 2:
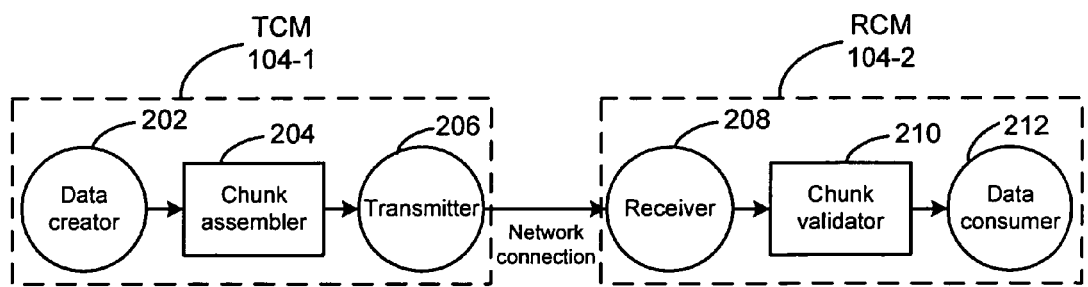
FIG. 2 depicts a more detailed embodiment of a transmitter connection manager (TCM) in a transmitter and a receiver connection manager (RCM) in a receiver.

FIG. 2 depicts a more detailed embodiment of a transmitter connection manager (TCM) 104-1 in a transmitter and a receiver connection manager (RCM) 104-2 in a receiver. As shown, TCM 104-1 includes a data creator 202, a chunk assembler 204 and a transmitter 206 and RCM 104-2 includes a receiver 208, a chunk validator 210, and a data consumer 212. Although TCM 104-1 and RCM 104-2 may be found in different devices 102, such as device 102-1 and device 102-2 or 102-3, respectively, it should be noted that TCM 104-1 and RCM 104-2 may be found in a single device 102. Further, it should be noted that the communications may be full duplex in nature although only one direction of the communication is described. Also, although only one receiver is shown (point to point) it will be understood the data may be sent to multiple receivers (point to multipoint).

Data creator 202 includes any device that is configured to provide data to chunk assembler 204. In one embodiment, the data may be a stream of continuous data. Data creator 202 may receive data from a device, such as a user device. For example, during a telephone call, the user device may send data to device 102. Data creator 202 may receive the data and forward it to chunk assembler 204. In another embodiment, data creator 202 may create data for transmission. Although data creator 202 is shown as being included in TCM 104-1, it will be understood that it may be separate from TCM 104-1.

The data sent to chunk assembler 204 may or may not be time sensitive. However, the techniques provided for chunk recovery, as described, are useful for improving the connection quality that is typically desired for time-sensitive information.

Chunk assembler 204 is configured to segment the data stream received from data creator 202 into chunks of data. In one embodiment, the chunks are of a fixed size that can be any size. The size of the chunks affects delay in sending chunks. For example, if the fixed size is larger, then chunk assembler 204 may have to wait longer to receive enough data to form a chunk of the fixed size. This may increase delay in sending data across the network connection. If the network connection is slow, then the fixed size might be decreased because it would be desirable to send chunks more frequently to compensate for the slow transit time. Thus, RCM 104-2 is not idle for periods of time while waiting for data.

The number of chunks that are created is determined based upon the amount of reliability desired. For the best reliability, the data stream may be broken up into two chunks before a recovery chunk is created. However, any number of chunks may be created that are greater than two before recovery chunk is created. As the number increases, the possibility that more than one chunk is lost increases, thus reducing reliability.

After the number of chunks are created, chunk assembler 204 creates a recovery chunk. In one embodiment, a parity equation is used to create the recovery chunks. For example, a byte index, i, starting at the top of the chunk is represented by chunk $A_i$; where i counts from 0 to chunk size −1. To create the recovery chunk, a byte (e.g., the first byte) is exclusive-ORed (XOR) with a corresponding byte (e.g., the first byte) in the next chunk and the result is then XORed with a corresponding byte (e.g., the first byte) in the following chunk until all chunks are exhausted (e.g., all corresponding bytes have all been XORed). The result of the XORing of all the bytes (e.g., a byte-size series of information) is then inserted into the recovery chunk. This process continues for all the bytes (e.g., the second bytes, third bytes, and so on) found in the chunks. Because the chunks are all the same size, each byte of the recovery chunk represents an XOR of bytes from each of the chunks.

Chunk assembler 204 then inserts information for a control field. The control field may include a sequence number, chunk identifier (ID), and/or chunk group length. The sequence number is the number that the chunk is in the sequence of chunks in the group. The sequence number also allows chunk assembler 204 to determine which chunk is a recovery chunk. The chunk ID identifies the group the chunk is associated with (for example, if multiple groups of chunks are being multicast). The chunk group length is the number of chunks in a group. The control information may include all or any part of the above information depending on the embodiment.

As mentioned above, the control field allows RCM 104-2 to determine whether the chunk received is a recovery chunk or a chunk with data in it. In one embodiment, the sequence number is incremented for each chunk sent. The chunk group length may be used with the sequence number to determine whether the chunk is a recovery chunk for the preceding chunks sent. For example, the number of chunks in a group are counted using the sequence number and the last chunk in the group is the recovery chunk. Using the control field allows for dynamic configurability of the connection based upon recent chunk loss statistics. For example, the number of chunks included in a group can be changed and can be easily detected at RCM 104 because the chunk length may be varied and may be used to determine which chunk is a recovery chunk. Other techniques for flagging a recovery chunk may also be appreciated.

Also, RCM 104-2 can determine whether a chunk is lost or not. If the sequence numbers are incremented by a known amount, RCM 104-2 can determine that a chunk is lost if the sequence of sequential numbers is broken.

Transmitter 206 is then configured to send the chunks and the additional recovery chunk to RCM 104-2. Each chunk may be assembled into a medium transfer unit and sent over a network connection. For example, the chunks of data may be configured into Ethernet packets, ATM cells, or any other unit that is used to transfer data over a network connection. In one embodiment, headers and trailers may be added to the chunk to generate a medium transfer unit.

RCM 104-2 is configured to receive the medium transfer units. Receiver 208 recreates the chunks of data from the medium transfer units. The chunks of data are then sent to chunk validator 210, which validates if any medium transfer units were lost during transmission.

Chunk validator 210 is configured to take the chunks and recreate the original data stream for transmission to data consumer 212. Chunk validator 210 waits an unspecified amount of time such that the medium transfer units with the chunks are received along with the recovery chunk.

Chunk validator 210 then determines if one of the chunks is missing. If one chunk is missing, chunk validator 210 recreates the missing chunk using a reassembly algorithm and the recovery chunk. If more than one chunk is missing, chunk validator 210 may not be able to recreate the missing chunk and thus passes the received chunk data to data consumer 212. The recovery chunk is discarded in this case.

If the recovery chunk is missing, no action is taken by chunk validator 210 and the chunks that are received are sent to data consumer 212.

In one embodiment, the following reassembly algorithm may be used in order to determine a chunk that is missing due to loss of a medium transfer unit. Assuming there are three chunks, A, B, and C, and one recovery chunk, R, and a chunk B is missing due to a medium transfer unit loss, chunk B may be recovered based on chunk A, chunk B, and the recovery chunk R. The reassembly algorithm XORs bytes from chunk $A_i$, chunk $C_i$ and recovery chunk $R_i$, where "i" is a position of a byte in the chunks. The result of the XOR is placed into a new chunk $B_i$; at a position i. This process is performed for each byte until the index i equals chunk size −1. Thus, for every single byte in each chunk that is received, a byte may be restored to a new chunk B. After performing the XOR chunk size −1 times, the missing chunk data is fully restored. Because the missing chunk is to generate the recovery chunk before transmission, the missing chunk can be recovered using the recovery chunk and the rest of the received chunks in the group. Although this reassembly algorithm is described, it will be understood that other algorithms may be used.

Figure 3:
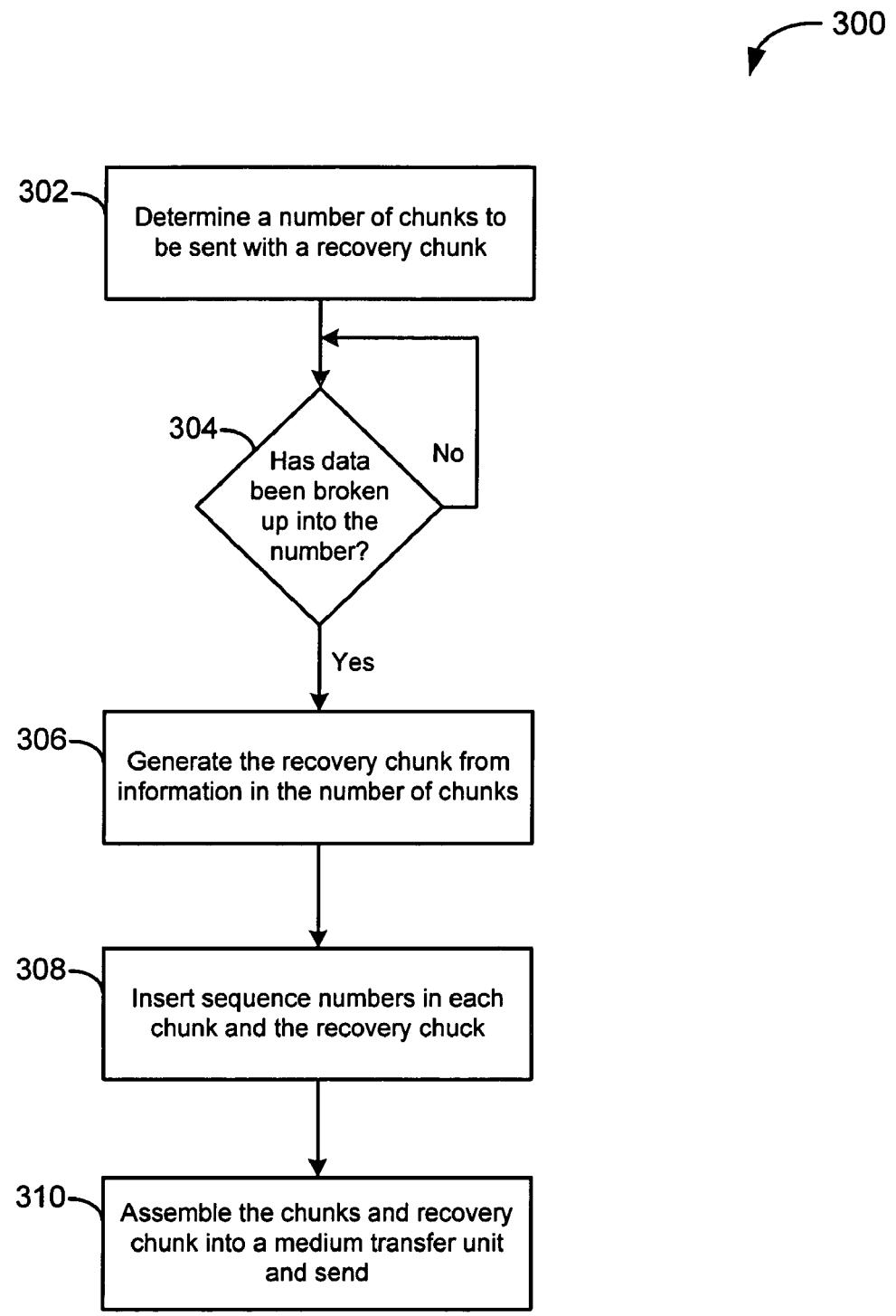
FIG. 3 shows a simplified flowchart describing a method of sending chunks of data according to one embodiment of the present invention.

FIG. 3 shows a simplified flowchart 300 describing a method of sending chunks of data according to one embodiment of the present invention. In step 302, a number of chunks to be sent with a recovery packet are determined. As will be described below, historical packet loss may be analyzed in order to determine the number of chunks that should be sent in a group for a recovery chunk.

In step 304, it is determined if data has been broken up into the number of chunks. If not, the process continues as more data is received and broken up into chunks.

When the data has been broken up into the number of chunks, in step 306, the recovery chunk is generated from information in each of the number of chunks. As described above, the bytes of each chunk may be XORed and the results placed in a byte in the recovery chunk. This process continues with subsequent bytes until a recovery chunk is generated.

In step 308, the control field is inserted in each chunk and the recovery chunk.

In step 310, the chunks and recovery chunk are assembled into medium transfer units and sent to a receiver.

Figure 4:
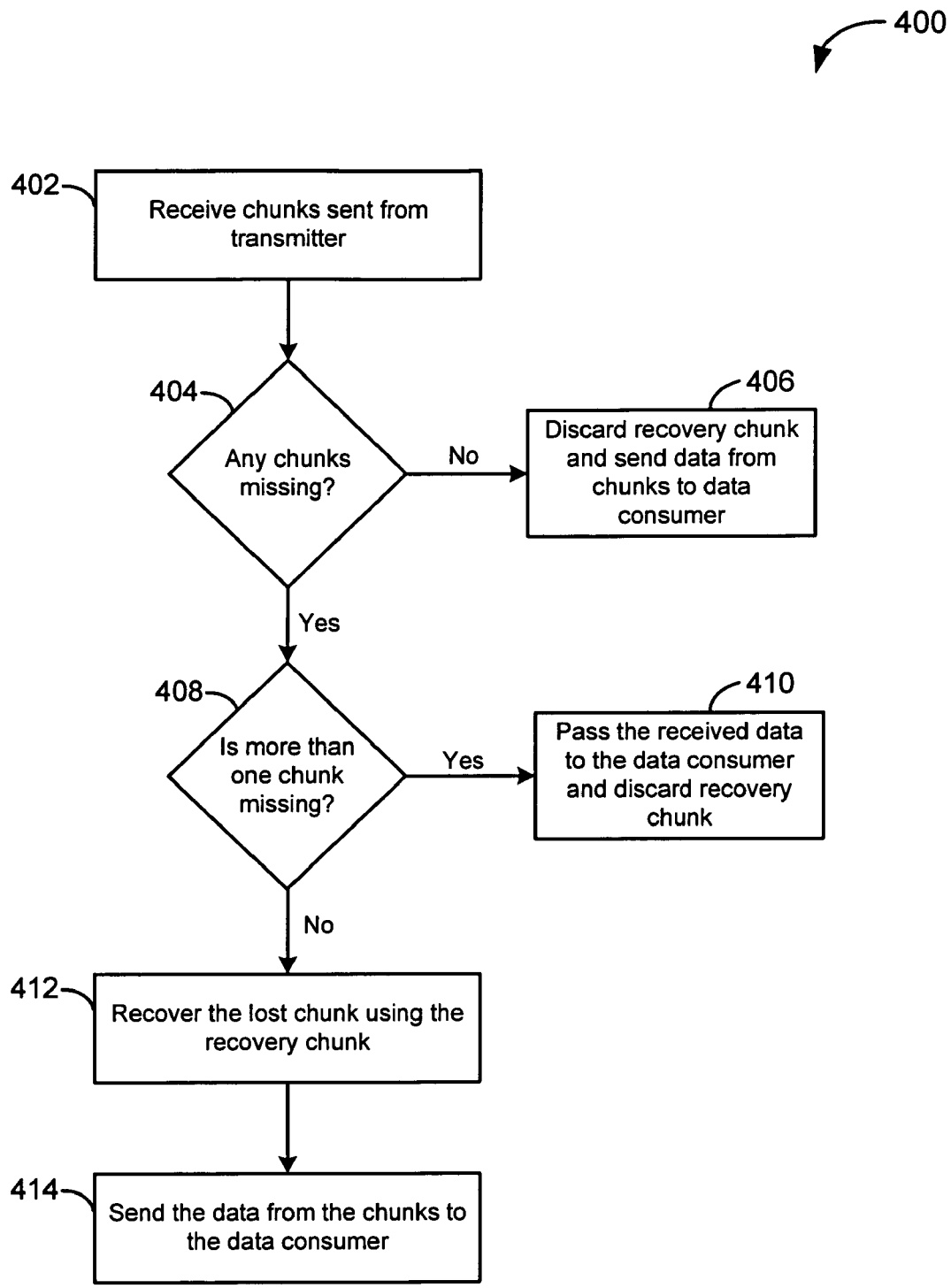
FIG. 4 depicts a simplified flowchart of a method of receiving chunks of data according to one embodiment of the present invention.

FIG. 4 depicts a simplified flowchart 400 of a method of receiving chunks of data according to one embodiment of the present invention. In step 402, the medium transfer units are received and the chunks are determined.

In step 404, it is determined if any chunks are missing. If no chunks are missing, in step 406, the recovery chunk is discarded and the data in the chunks are sent to data consumer 212.

If chunks are missing, in step 408, it is determined if more than one chunk is missing. If more than chunk is missing, then in step 410, the received data in the chunks is passed to data consumer 212 and the recovery chunk is discarded. In this case, the missing chunks cannot be recovered.

If only one chunk is missing, then in step 412, the lost chunk is recovered using the recovery chunk. In step 414, the data in the chunks are then sent to the data consumer 212. In this case, a full representation of the data transmitted from transmitter 206 is sent to data consumer 212.

Figure 5:
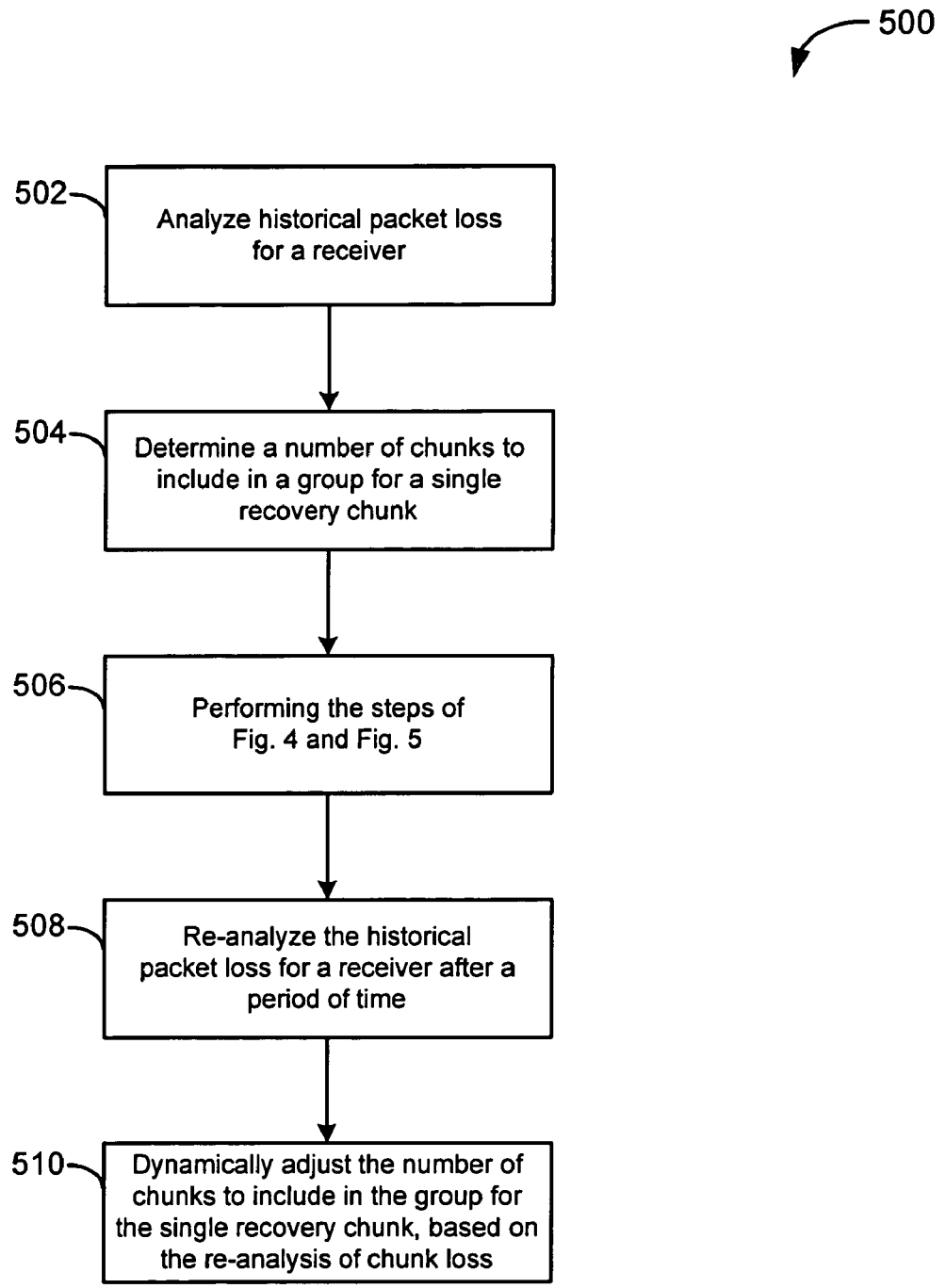
FIG. 5 depicts a simplified flowchart depicting the dynamic feature of the packet loss recovery techniques according to one embodiment of the present invention.

As mentioned above, the number of chunks included in a group in which a recovery chunk is created historically may be dynamically adjusted and variable. Depending on the number of chunks being lost, the number of chunks included in a group may be increased or decreased. FIG. 5 depicts a simplified flowchart 500 depicting the dynamic feature of the chunk loss recovery techniques according to one embodiment of the present invention. In step 502, the historical packet loss for a receiver is analyzed. For example, the number of chunks lost per group being sent may be determined. If the number is greater than one, then this means that the lost chunks were not able to be recovered using the recovery chunk for the group. Thus, performance may be degraded. In this case, the number of chunks included in a group may be decreased. This, however, would increase the bandwidth used because more recovery chunks would be sent per number of chunks sent. But the chances of recovering a lost chunk are increased.

If less than one chunk is being lost per group, then the number of chunks included in a group may be increased. In this case, extra bandwidth is being used because it is possible fewer recovery chunks may be sent while maintaining the same reliability. For example, if the number of chunks in a group is increased, the full set of chunks may still be passed to data consumer 212 because one or no chunks are still lost in the larger group.

In step 504, a number of chunks to include in a group for a single recovery chunk is determined. This is determined based on the above analysis.

In step 506, the steps of FIGS. 4 and 5 are performed. These steps send the chunks across the network connection to a receiver where a lost chunk may be recovered in a group of chunks if only one chunk is missing.

In step 508, the historical packet loss for a receiver over a period of time is re-analyzed to determine if the number of chunks being included in a group for a single recovery chunk is optimal. This reanalysis may be performed at any time, such as at periodic intervals.

In step 510, the number of chunks to include in the group for a single recovery chunk may be dynamically adjusted based on the re-analysis of chunk loss. Thus, for example, if packet loss is high for a group of packets, then the number of chunks included in the group may be decreased. This will provide for more reliability because the chance of only one chunk being missing in a group is increased. However, if packet loss is low, then the number of chunks in the group may be increased. This will result in less bandwidth being used because less recovery chunks are being added to the stream of medium transfer units being transmitted across the network connection. However, there is a chance that increasing the number of chunks in a group will affect reliability because it is more likely that more than one packet will be lost in a group.

Embodiments of the present invention provide many advantages. For example, the dynamic nature of reconfiguring the number of chunks in a group allows the user to adjust reliability of a connection based on recent activity. The number of chunks in a group may be easily changed and also without much overhead by just changing the sequence number inserted in packets. Accordingly, reliable communications may be efficiently provided.

The following is an example of dynamically adjusting the number of chunks to send in a group with a recovery chunk. A variable, numberOfChunks, is initialized to a number, such as 10. This variable is the number of chunks to include in the group. As will be discussed below, as the variable changes, the number may not be immediately asserted as the number to be included in a group. Rather, a period of time may elapse before asserting the value. The actual value depends on the frequency of the data and amount of delay to be tolerated. A high rate of traffic may use a higher initial value. A low speed connection may use a lower value although not lower than 2. A value of 2 uses approximately 66% of the bandwidth for data, the rest is error correction information.

This variable is updated based upon incoming error rates. With numberOfChunks set to 10, TCM 104-1 sends 10 chunks with the $11^{th}$ chunk being a recovery chunk. This achieves about a 91% connection efficiency rating. That is, 9% of the bandwidth is used for error management.

Next, the error rate is determined. The error rate is the number of chunks lost per number of packets received. RCM 104-2 initializes a Packet Error Rate (PER) to 0 and then adjusts the rate as chunks are lost (e.g. lost chunks/total received chunks). As the PER increases, the numberOfChunks variable decreases until it hits a minimum of 2. The PER is sampled over some interval to determine if the rate of change is increasing or decreasing. If the rate of change is increasing, numberOfChunks is adjusted upward by 1, until a maximum is reached. The maximum may be any number. In one embodiment, the maximum length is based on packet size and speed of connection.

In the case of bidirectional point to point links, the variable value may flow within the headers of packets being exchanged. For example, RCM 104-2 may insert that TCM 104-2 should set numberOfChunks to a different value. In the case of unidirectional traffic, typical of multicast situations, a separate control connection may established. Note, the control connection does not need to be reliable, RCM 104-1 would continue to send control packets at some reasonable interval (once a second) to change the variable numberOfChunks, until RCM 104-1 noticed the numberOfChunks value in the header of the incoming packet stream is changed. In the event of errors on the control channel, the numberOfChunks value is not changed until it is fully acknowledged by both sides.

The present invention can be implemented in the form of control logic in software or hardware or a combination of both. The control logic may be stored in an information storage medium as a plurality of instructions adapted to direct an information-processing device to perform a set of steps disclosed in embodiments of the present invention. Based on the disclosure and teachings provided herein, a person of ordinary skill in the art will appreciate other ways and/or methods to implement the present invention.

The above description is illustrative but not restrictive. Many variations of the invention will become apparent to those skilled in the art upon review of the disclosure. The scope of the invention should, therefore, be determined not with reference to the above description, but instead should be determined with reference to the pending claims along with their full scope or equivalents.

What is claimed is:

1. A method for providing for chunk loss recovery, the method comprising:
   segmenting data, for transmission to a device, into a plurality of chunks;
   determining a number of chunks, of the plurality of chunks, to be used as a group for creating a recovery chunk, wherein the number of chunks of data is determined by balancing between transmission bandwidth efficiency and transmission reliability;
   creating the recovery chunk from information in each of the number of chunks in the group, wherein the recovery chunk is used to recover a single lost chunk from the group; and
   transmitting the group of chunks and the recovery chunk to the device, wherein the transmission bandwidth efficiency increases as the number of chunks in the group increases, and the transmission reliability decreases as the number of chunks in the group increases.

2. The method of claim 1, wherein creating the recovery chunk comprises using a parity equation to generate the recovery chunk using the information in each of the number of chunks in the group.

3. The method of claim 2, wherein using the parity equation comprises XOR'ing information from the number of chunks in the group to generate a result, wherein the result is stored in the recovery chunk.

4. The method of claim 1, wherein determining the number of chunks to include in the group comprises using an algorithm based on a historical number of chunks lost at the device to determine the number of chunks that are included in the group.

5. The method of claim 4, further comprising dynamically adjusting the number of chunks to include in the group for the recovery chunk based on the historical number of chunks lost at the device, wherein the number in the group is decreased if chunk loss at the device is determined to have increased and the number in the group is increased if chunk loss is determined to have decreased.

6. The method of claim 5, further comprising receiving transmission control information from the device indicating the number of chunks to dynamically adjust.

7. The method of claim 1, further comprising adding a control field to each of the number of chunks in the group and the recovery chunk, wherein the control field contains sequence information to enable determination if a chunk in the group is lost.

8. The method of claim 7, wherein the control field is used to determine if a chunk is the recovery chunk for the group.

9. The method of claim 1, further comprising:
   determining a chunk in the group of chunks that is lost; and
   using the recovery chunk to generate the lost chunk.

10. The method of claim 1, wherein transmitting the group of chunks and recovery chunk comprises transmitting each of the number of chunks and the recovery chunk in a medium transfer unit to the device, wherein the medium transfer unit is lost.

11. A method for providing for chunk loss recovery, the method comprising:
   analyzing historical chunk loss at a receiver;
   determining a number of chunks into which data, for transmission to a device, is grouped with a single recovery chunk, wherein the determining is based on the analysis and on a balance between transmission bandwidth efficiency and transmission reliability;
   creating the recovery chunk from information in each of the number of chunks in the group;
   transmitting the group of chunks and the recovery chunk to the device; and
   dynamically adjusting the number of chunks to include in the group for the recovery chunk based on chunk loss at the receiver, wherein the number in the group is decreased if chunk loss at the receiver is determined to have increased and the number in the group is increased if chunk loss is determined to have decreased, and wherein the transmission bandwidth efficiency increases as the number of chunks in the group increases, and the transmission reliability decreases as the number of chunks in the group increases.

12. The method of claim 11, further comprising adding a control field to each of the number of chunks in the group and the recovery chunk, wherein the control field contains sequence information to enable determination if a chunk in the group is lost.

13. The method of claim 12, wherein the control field is used to determine if a chunk is the recovery chunk for the group.

14. The method of claim 13, wherein when the dynamic adjustment of the number of chunks occurs, the control field that is used to indicate which chunk is the recovery chunk in the group is added to a recovery chunk based on the dynamic adjustment.

15. The method of claim 11, further comprising receiving transmission control information from the device indicating the adjustment to the number of chunks to include in the group.

16. The method of claim 11, further comprising:
   determining a chunk in the group of chunks that is lost; and
   using the recovery chunk to generate the lost chunk.

17. The method of claim 11, wherein transmitting the group of chunks and recovery chunk comprises transmitting each of the number of chunks and the recovery chunk in a medium transfer unit to the device, wherein the medium transfer unit is lost.

18. A system for providing for chunk loss recovery, the system comprising:
   a transmitter comprising:
      a chunk assembler configured to:
         determine a number of chunks into which data, for transmission to a device, is grouped for creating a recovery chunk, wherein the determining is based on a balance between transmission bandwidth efficiency and transmission reliability;
         create the recovery chunk from information in each of the number of chunks in the group; and
      a communicator configured to transmit the group of chunks and the recovery chunk to the device, wherein the transmission bandwidth efficiency increases as the number of chunks in the group increases, and the transmission reliability decreases as the number of chunks in the group increases;
   a receiver comprising:
      a chunk receiver configured to receive the group of chunks and the recovery chunk, the receiver comprising:
      a chunk validator configured to validate whether a chunk is lost in the group of chunks that was sent from the communicator;
      a chunk recovery device configured to use the information in the recovery chunk to recover a single lost chunk in the group of chunks.

19. The system of claim 18, wherein the data comprises time sensitive data.

20. The system of claim 18, wherein the receiver is configured to dynamically adjust the number of chunks to group with the recovery chunk.

21. The system of claim 20, wherein the receiver is configured to transmit the adjustment to the communicator.

* * * * *